Nov. 9, 1965 B. E. SHLESINGER, JR 3,217,283

MINIATURE PRINTED CIRCUIT PINBOARD

Filed Dec. 26, 1962 2 Sheets-Sheet 1

INVENTOR
Bernard Edward Shlesinger, Jr.
Bernard Edward Shlesinger Jr.

MINIATURE PRINTED CIRCUIT PINBOARD

Filed Dec. 26, 1962 2 Sheets-Sheet 2

INVENTOR
Bernard Edward Shlesinger, Jr.
Bernard Edward Shlesinger Jr.

United States Patent Office 3,217,283
Patented Nov. 9, 1965

3,217,283
MINIATURE PRINTED CIRCUIT PINBOARD

Bernard Edward Shlesinger, Jr., Annandale, Va., assignor to AMP Incorporated, Harrisburg, Pa.
Filed Dec. 26, 1962, Ser. No. 247,164
14 Claims. (Cl. 339—18)

This invention relates to printed circuit pin boards of the miniature type, in which the printed circuit pin board has removable pin cross-connectors for selectively connecting various portions of the printed circuits.

Heretofore, printed circuit boards have been large and bulky and miniaturization has been difficult because of the type of cross-connectors in use in the art. While some reduction in size has been accomplished, weaknesses in design have resulted in shorting, loose connectors, and short lifespan.

This invention is intended to eliminate various problems arising in the miniaturization of pin boards. The invention has various applications in the electronics field and may be used in the fields of telephony, programming, telegraphy, education, and testing for example.

It is therefore an object of this invention to provide a miniature pin board having pin holes of minute size as for example 1/32 inch in diameter or smaller. It is further contemplated that the pins may be as small as to have a diameter less than that of a human hair.

It is an object of this invention to provide an easily operated, miniature printed circuit pin board having cross-connecting pins which are readily and removably connected to the printed circuit board.

A further object of this invention is to provide pins for a miniature pin board which afford a good wiping contact and an effective electrical connection while simultaneously insuring a stable anchoring to the printed circuit board and the elimination of arcing and shorting.

Still another object of this invention is to provide a printed circuit pin board of miniature size which is easily manufactured for a minimum of cost.

Yet another object of this invention is to provide cross-connecting pins for pinboards which are inexpensive and readily manufactured from standard materials such as flexible, conductive wire of very small cross-section.

A further object of this invention is to provide a miniaturized pin board system which can be used in rocketry and the like where weight and size of the components are critical.

A still further object of this invention is to provide a pin board system which may utilize printed circuits or standard connections as desired.

Yet another object of this invention is to provide a pin board in which the pins are provided with means for maintaining a constant pressure on the conductor areas to assure a closed circuit under varying conditions of acceleration, vibration, shock or the like.

Another object of this invention is to provide a printed circuit pin board assembly which comprises a plurality of printed circuit pin boards in stacked relation.

These and other objects and advantages of this invention will be apparent from the following description and claims:

*Angled pin hole board*

Figure 1:
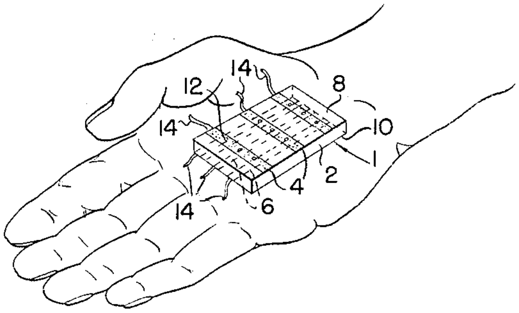
FIGURE 1 is a perspective view of the printed circuit pin board being held in a human hand to illustrate the miniature size of the pin board.

FIGURE 1 is an illustration of the size of the miniature printed circuit pin board 1 as held in the human hand. In application, the printed circuit pin board could be smaller than shown.

Pin board 1 includes a nonconductive board portion 2, and printed circuits 4 and 6 on surfaces 8 and 10 thereof, respectively. A plurality of pinholes or apertures extend through the board portion 2. Leads 14 are connected to printed circuits 4 and 6 by any suitable means and are for connecting printed circuits 4 and 6 to the circuits or devices in which the pin board is used.

FIGURE 1 shows the printed circuit board 1 as rectangular in shape, and the printed circuits 4 and 6 as elongated conductive strips. This structure is only used in an illustration, and the printed circuit board of the invention is not limited to this shape.

Figure 2:
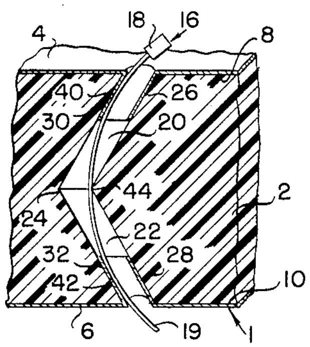
FIGURES 2 through 5 are fragmentary views partially in section of various forms of the pin board with the cross-connecting pins mounted therein with the parts exaggerated in dimension for purposes of illustration.

FIGURE 2 gives an illustration of the cross-connector 16 in an operative position in a pinhole 12 of printed circuit board 1. Cross-connector 16 has an insulated portion 18 and an elongated flexible conductive wire member 19.

The pinhole 12 includes two straight line bores 20 and 22 which are formed at acute angles with respect to a line substantially perpendicular to the surfaces 5 and 6 of board portion 2. The bores 20 and 22 meet at 24 to form the complete pinhole 12. Bores 20 and 22 have counterbores 26 and 28 therein respectively.

Printed circuits 4 and 6 have conductive sleeves 30 and 32 extending a substantial distance into bores 20 and 22.

The pinholes 12 of board 2 may be drilled or molded by suitable molding means.

The printed circuits may be produced by any suitable means.

Before insertion into the pinhole 12, the flexible conductive wire member 19 is substantially straight. On insertion, the conductive wire member 19 flexes to generally conform to the longitudinal tortuous shape of pinhole 12. Because of the spring action of the wire member 19 while it is inserted, the wire member 19 tends to maintain a straight line. Due to this spring action, the conductive wire member 19 contacts the conductive sleeves 30 and 32 at points 40 and 42 as well as at point 44 of the pinhole 12, thus providing electrical continuity between the printed circuit 4 and the printed circuit 6. The sleeves 30 and 32 may be ferrule inserts of conductive material or printed areas of conductive material. Because of the frictional engagement at points 40, 42, and 44, the cross-connector pin 16 provides good electrical contact while simultaneously anchoring the pin 16 within the pinhole 12.

The diameter of the wire member 19 may be only slightly smaller than the diameter of the pinhole 12. Also the angle at which the bores meet is exaggerated for clarification. The angle may actually be slight and just sufficient to give a binding action to resist withdrawal of the pin without adequate pull.

The pinhole shown in FIGURES 2 to 5 is notably larger in diameter than the pin itself in order to afford flex of the pin in the holes to gain a good wipe and proper contact. Actually, the pin need only be slightly less in diameter than the pin hole but sufficiently so to give some slope or play when first inserted in order to properly function as it traverses the angles in the hole.

Figure 3:
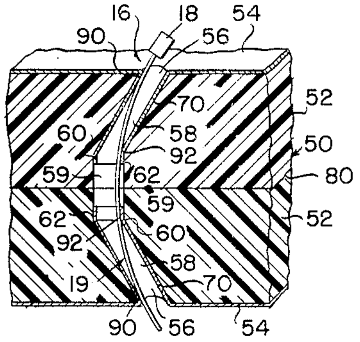

FIGURE 3 illustrates another form of a printed circuit pin board 50. The pin board 50 comprises nonconductive boards 52. Each of the boards 52 has printed circuits 54 on one surface thereof. Each of the boards 52 has one or more pinholes 56 extending therethrough. The boards 52 may be formed identically. Bore 58 is formed at an acute angle with respect to a line perpendicular to one plane of board 52. Bore 59 is formed substantially perpendicular to one plane of the board 52. Bores 58 and 59 meet each other at point 60 to form the complete pinhole 56. The bore 58 is shown to be substantially longer in length than bore 59. This is only an example of one form. The bore 58 could be shorter than the bore 59. The diameter of bore 58 is substantially the same as the diameter of the counterbore 62 of bore 59.

Printed circuit 54 has a conductive sleeve portion 70 extending through bore 58 and into the counterbore 62 of bore 59. The pin board 50 is formed by securing one surface of one of boards 52 to one surface of another board 52 at 80. The securing of the boards to each other at 80 may be accomplished by any suitable means. The bore 58 of one board 52 is positioned at an acute angle with respect to the bore 58 of the other board 52.

On insertion of the cross-connector pin 16 into the pinhole 56, the conductive wire member 19 flexes or deforms to generally conform to the longitudinal tortuous shape of pinhole. Because of the spring action of the wire member 19, as explained for FIGURE 1, the conductive wire member 19 contacts each of the conductive sleeves 70 at points 90 and 92, thereby providing electrical continuity between printed circuits 54 of one of the boards 52 with the printed circuits 54 of the other board 52. Because of the frictional engagement of conductive wire member 19 at points 90 and 92 on each sleeve 70 and the angle at which the force created by the spring action of the wire member 19, the cross-connector 10 has stable anchoring means within the pinhole. Also because of the wire member 19 contacting each sleeve 70 twice, the electrical contact is greatly increased.

The use of two boards 52 in FIGURE 3 could also be used to form the insulated board portion 2 of FIGURE 2.

Figure 4:
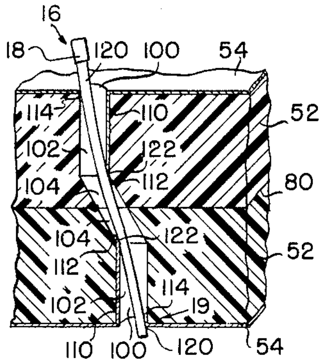

The form of the printed circuit board in FIGURE 4 shows another shape of the pinhole 100. The pinhole 100 is formed by two bores 102 and 104 in each of the boards 52. In this application the boards 52 are formed identically and reversed when united to form the assembly.

Bore 102 is formed substantially perpendicular with respect to one plane of board 52. Bore 104 is formed at an acute angle with respect to the longitudinal length of bore 102 or one plane or surface of the board 52.

Printed circuit 54 has conductive sleeve 110 extending into the bore 102, and the sleeve 110 has a lip 112 extending into the bore 104. The sleeve 110 has a portion 114 of its wall extending a short distance into bore 102.

When the cross-connector 16 is inserted in pinhole 100, the wire member 19 contacts sleeve 110 at points 120 and 122 to provide a good wiping contact. The same effect of the spring action of wire member 19 is the same as that explained in FIGURE 3.

Figure 5:
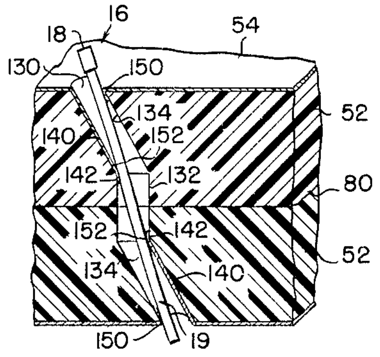

FIGURE 5 has insulated boards 52 similar to the boards 52 of FIGURE 3, except one board is turned around to form the pinhole 130. Pinhole 130 includes a bore 132 substantially perpendicular to one plane of board 52. Bore 134 is formed at an acute angle with respect to the bore 132 or one plane of board 52, and the sleeve 140 has a lip 142 extending into bore 132.

When the cross-connector 16 is inserted into pinhole 130, the wire member 19 has wiping contact with the sleeve 140 at points 150 and 152. The wiping contact is similar in action to that explained for FIGURE 4 and the spring action is also the same.

*Straight pinhole board*

In certain applications of a printed circuit pin board, it might be desirable to use a straight line bore for the pinhole. FIGURES 6–10 illustrate various forms of cross-connectors for use with this type of pin board.

The cross-connectors shown in FIGURES 6 through 10 could in some cases be used with the tortuous pinholes of FIGURES 2 through 5 in order to give better locking action.

Figure 6:
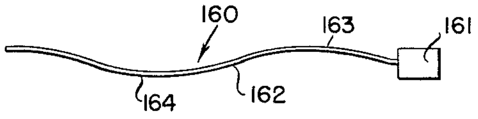
FIGURES 6 through 9 are side views illustrating various pins which may be adapted for use in a pin board of this invention.

FIGURE 6 shows a cross-connector 160 having an insulated portion 161 and a flexible conductive wire member 162. The wire member 162 is curved at one end to form a spring area 163. Intermediate of spring area 163 and one end of wire member 162 is another curved portion to form another spring area 164. The curve of spring area 164 is formed in a direction differing from the directions of the curve of spring area 163. The longitudinal length of wire member 162 forms a sine-wave shape.

Figure 7:
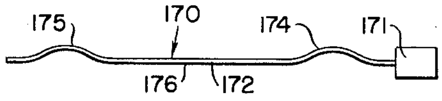

FIGURE 7 shows a cross-connector 170 having an insulated portion 171 and flexible conductive wire member 172. Wire member 172 includes two spring areas 174 and 175. Between the spring areas 174 and 175 is a substantially straight line portion 176. Spring area 174 is curved in the same direction as spring area 175.

Figure 8:
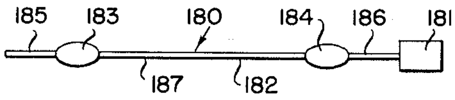

The cross-connector 180 of FIGURE 8 includes an insulated portion 181 and a flexible conductive wire member 182. Wire member 182 includes two enlarged bead areas 183 and 184 intermediate of the ends thereof. Wire member 182 has substantially straight line portions 185 and 186 between each end thereof and the enlarged bead areas 183 and 184. Also wire member 182 has a substantially straight line portion 187 between the enlarged bead areas 183 and 184 thereof.

Figure 9:
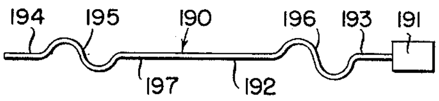

The cross-connector 190 of FIGURE 9 includes an insulated portion 191 and a flexible conductive wire member 192. Wire member 192 includes substantially straight line portions 193 and 194 at the ends thereof. At the inner ends of straight line portions 193 and 194 are S-shaped spring areas 195 and 196. Between S-shaped areas 195 and 196 is a substantially straight line portion 197.

Figure 10:
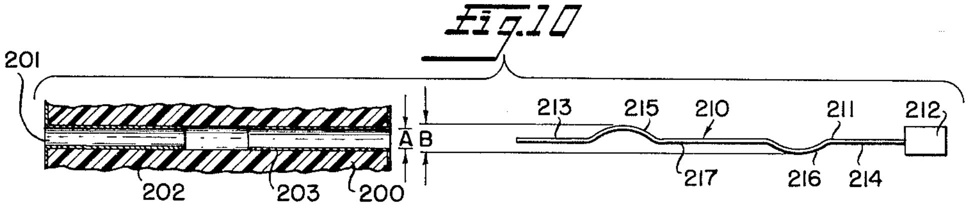
FIGURE 10 is a fragmentary exploded view of one form of the pin board and its connecting pin.

FIGURE 10 shows an insulated board 200 having a pinhole 201 therethrough. Within pinhole 201 are conductive sleeves 202 and 203. Conductive sleeves 202 and 203 are connected electrically to printed circuits (not shown) on surfaces of the board 200.

Cross-connector 210 includes a flexible conductive wire member 211 and an insulated portion 212. Wire member 212 has substantially straightline portions 213 and 214 at the ends thereof. At the inner ends of straightline portions 213 and 214 are curved spring areas 215 and 216. Between spring areas 215 and 216 is a substantially straightline portion 217. Spring area 215 is curved in a direction opposite that of a spring area 216. The spring areas of the wire members of FIGURES 6 to 10 are laterally projecting with respect to the longitudinal axis of the wire member.

The spring areas of the flexible wire member of the cross-connectors of FIGURES 6 through 10 in the position as they are shown, are slightly wider than the diameter of the pinholes, as illustrated by the arrows A and B of FIGURE 10. A represents the diameter of the hole 201. B represents the width of the pin 210 prior to insertion into the pin hole 201. Upon insertion, the pin tends to flatten out and elongate since it is going into a smaller opening than its own lateral width. The insertion of the pin tends to flex the pin and cause it to store energy which in turn locks the pin in the pinhole thereby preventing easy slippage and withdrawal.

*Insertion action*

Figures 11, 12, 13:
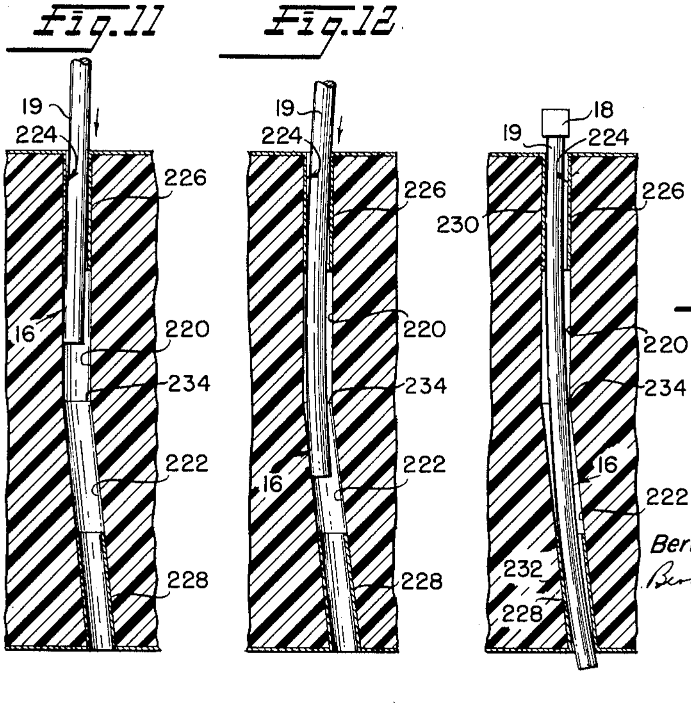
FIGURES 11 through 13 are enlarged fragmentary views partially in section of one form of the printed circuit pin board and illustrating various positions of one form of the cross-connecting pin in the process of being connected to the printed circuit pin board.

FIGURES 11 through 13 which disclose a pinhole having a straight bore portion 220 and an angle portion 222 show the steps of the flexing of the flexible conductive wire member 19 when cross-connector 16 is inserted into the pinhole 220. FIGURE 11 shows the wire member 19 inserted into bore 220. FIGURE 12 shows the wire member 19 as it flexes to conform to bores 220 and 222. FIGURE 13 shows the cross-connector 19 completely inserted into the pinhole 224 and the distortion and the spring action of the wire member 19 and the wiping engagement of the wire member 19 with conductive sleeves or printed circuit areas 226 and 228 at the points 230 and 232. Note the frictional engagement of the wire member 19 with the pin board at the angle 234 formed by the intersection of the bores 220 and 222.

Though this application shows various pinholes, it is obvious that other types of pinholes could be used which would operate under the principles set out in this invention as for example curved pinholes having various arcs. The difficulty in using curved pinholes would be the expense in manufeaturing pinholes of this type.

The pinboards may have as many pinholes as desired. Because of the very small size of the pinholes and the pins the pinholes may be formed close together without resulting in a short circuiting or arcing of the cross-connectors one with another. It is also obvious that many more pins can be utilized in a system of this type than heretofore practical.

The use of flexible wire, such as disclosed in this invention, allows for miniaturization not possible while using the type of cross-connectors in the prior art. Prior art developments generally show straight pins having no flexure, or pins which have some flexure due to a slot in the center of the pin. The slotting of such tiny pins as used in this invention is not practical nor feasible. Slotted pins become unsatisfactory after a number of insertions because of the weakened metal structure at the point of the slot. The spring fingers of the pin formed by the slot tend to lose their resiliency and eventually the pin has to be discarded because of failure to make proper contact. In the present invention, the resiliency is not effected by any slotting or the like and will maintain itself for indefinite periods of time.

It is obvious that pin boards of various types can be used with this invention. Stacked or laminated boards or sandwiched boards can be used in which the conductive circuits are printed and then placed on the inside of the board rather than on the outside as shown in the drawings. In these types, the printed areas as shown in the drawings will be inverted and placed against a non conductive sandwiched member so as to protect the printed areas leaving the outside surfaces of the boards free from conductive surfaces.

While this invention has been described in connection with different embodiments thereof, it will be understood that it is capable of further modification, and this application is intended to cover any variations, uses, or adaptations of the invention following, in general, the principles of the invention and including such departures from the present disclosure as come within known or customary practice in the art to which the invention pertains, and as may be applied to the essential features hereinbefore set forth and as fall within the scope of the invention or the limits of the appended claims.

Having thus described my invention what I claim is:

1. A programming pinboard for use with flexible pin connectors including (a) a solid substantially non-deformable insulated board having a top and bottom surface (b) a series of uniform diameter pin holes extending through said insulated board from said top to said bottom surface (c) said pin holes comprising at least two straight line bores abutting each other intermediate said surfaces at an angle less than 180°

(d) at least one of said bores being set at an angle acute to the surfaces of said board (e) said bores having the same uniform diameter (f) a conductive sleeve extending into each of said bores (g) said sleeves being spaced in non-contact relation from each other (h) at least a portion of one of said sleeves being set at an acute angle to the surfaces of said insulated board (i) conductive means leading from each of said sleeves (j) said sleeves having an internal diameter sufficiently greater than the diameter of a pin to be inserted therein whereby when said pin is inserted its full operative distance therein, it will be set in a flexed position with spaced portions of said pin in contact with portions of said conductive spaced sleeves.

2. A programming pinboard as in claim 1 and wherein (a) said sleeves and said conductive means leading therefrom are printed circuits.

3. A programming pinboard as in claim 1 and wherein (a) said insulated board comprises a pair of laminated members (b) said pin holes extending through said members (c) said pin holes comprising at least three straight line bores in abutting series relation to each other intermediate said surfaces, (d) said three bores forming a pair of angles of less than 180°, and (e) not more than two of said bores being in one of said laminated members.

4. A programming pinboard as in claim 3 and wherein (a) said sleeves have portions extending beyond the region of said angles.

5. A programming pinboard as in claim 4 and wherein (a) said pin holes are generally "C"-shaped.

6. A programming pinboard as in claim 4 and wherein (a) said pin holes are generally "S"-shaped.

7. A programming pinboard as in claim 1 and wherein (a) said pinboard includes in certain of said pin holes a miniature cross-connector pin including a flexible conductive wire member.

8. A programming pinboard as in claim 7 and wherein (a) said connector pins include spaced laterally projecting spring areas which prior to insertion into said pin holes, and when in relaxed condition, have a width greater than the diameter of said pinholes.

9. A programming pinboard as in claim 3 and wherein (a) at least two of said bores and two of said sleeves are set at an acute angle to the surfaces of said insulated board.

10. A programming pinboard as in claim 1 and wherein (a) said pinboard includes in at least one pinhole a pin having a pin head and a very thin flexible shank of substantially uniform diameter (b) said shank having a pair of laterally projecting longitudinally extending resilient bends offset from the longitudinal axis of said shank (c) said bends being positioned adjacent the ends of said shank with one bend of said pair being at each end (d) said shank having a straight non-configured flexible central section of substantially greater length than the length of any one of said bends (e) said central section axially aligned with the longitudinal axis of said pin and positioned between said pair of bends, and (f) said pinhead having a dimensional width substantially greater than said shank.

11. A programming pinboard as in claim 10 and wherein (a) said bends are projecting laterally in the same direction.

12. A programming pinboard as in claim 10 and wherein (a) said bends are projecting laterally in opposite directions to each other.

13. A programming pinboard as in claim 10 and wherein (a) said pin includes a second pair of spaced bends cooperating with said first mentioned pair to form S-shaped configurations.

14. A programming pinboard as in claim 1 and wherein (a) said pinboard includes in at least one pinhole a pin having a pin head and a very thin flexible shank substantially of uniform diameter (b) said shank having a pair of laterally projecting beads (c) said beads being positioned adjacent the ends of said shank with one bead of said pair being at each end (d) said shank having a straight non-configured flexible central section of substantially greater length than the length of any one of said beads (e) said central section axially aligned with the longitudinal axis of said pin and positioned between said pair of beads, and (f) said pinhead having a dimensional width substantially greater than said shank.

References Cited by the Examiner

UNITED STATES PATENTS

| | | | |
|---|---|---|---|
| 423,637 | 3/90 | Scribner | 339—222 |
| 1,488,948 | 4/24 | Smith | 339—278 X |
| 2,582,984 | 1/52 | Gray | 317—112 |
| 2,761,947 | 9/56 | Rice et al. | 339—196 X |
| 2,974,302 | 3/61 | Ellis | 339—278 |
| 3,010,093 | 11/61 | Berg | 339—256 |
| 3,028,573 | 4/62 | Stoehr | 339—18 X |

FOREIGN PATENTS

| | | |
|---|---|---|
| 967,302 | 3/50 | France. |
| 293,120 | 2/32 | Italy. |
| 143,171 | 4/61 | Russia. |

JOSEPH D. SEERS, *Primary Examiner.*

PATRICK A. CLIFFORD, *Examiner.*